US009345124B2

(12) United States Patent
Fu

(10) Patent No.: US 9,345,124 B2
(45) Date of Patent: May 17, 2016

(54) CHIP AND CIRCUIT STRUCTURE

(71) Applicant: SHENZHEN CHINA STAR OPTOELECTRONICS TECHNOLOGY CO., LTD., Shenzhen (CN)

(72) Inventor: Jianyong Fu, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 249 days.

(21) Appl. No.: 14/235,811

(22) PCT Filed: Nov. 7, 2013

(86) PCT No.: PCT/CN2013/086668
§ 371 (c)(1),
(2) Date: Jan. 29, 2014

(87) PCT Pub. No.: WO2015/058428
PCT Pub. Date: Apr. 30, 2015

(65) Prior Publication Data
US 2015/0296606 A1 Oct. 15, 2015

(30) Foreign Application Priority Data
Oct. 25, 2013 (CN) .......................... 2013 1 0511726

(51) Int. Cl.
H05K 7/00 (2006.01)
H05K 1/02 (2006.01)
(Continued)

(52) U.S. Cl.
CPC .............. *H05K 1/0203* (2013.01); *H01L 23/48* (2013.01); *H01L 23/552* (2013.01); *H05K 1/092* (2013.01);
(Continued)

(58) Field of Classification Search
CPC ........................... H05K 1/0225; H05K 1/0231
USPC .......................... 361/803, 700–710, 760–795
See application file for complete search history.

(56) References Cited

U.S. PATENT DOCUMENTS 5,068,631 A * 11/1991 Vince .................... H05K 1/0225
174/250
5,841,202 A * 11/1998 Noguchi ................ H04B 15/04
174/363

(Continued)

FOREIGN PATENT DOCUMENTS

CN 1476091 A 2/2004
JP 2009010273 A 1/2009
WO 2012153835 A1 11/2012

*Primary Examiner* — Tuan T Dinh
(74) *Attorney, Agent, or Firm* — Mark M. Friedman

(57) ABSTRACT

The present invention provides a chip structure and a circuit structure, chip structure is disposed on a printed circuit board provided with an element layer and a copper grounding layer, and comprises: a chip body disposed on the element layer and having a plurality of power pins; a power line disposed on the element layer for supplying electric power to the chip body; a plurality of power input lines, each of which has a body disposed on the copper grounding layer and two ends disposed on the element layer and connected with the body through corresponding through holes of the printed circuit board; and a plurality of bypass capacitors having one end connected with the power pins of the chip body through the element layer and the other end of the bypass capacitors connected with the power line through the power input line. The present invention further provides a chip structure. The power line of the chip structure and the circuit structure of the present invention is disposed on the element layer, so that the heat dissipation effect of the copper grounding layer is better, and the yield of the chip and corresponding circuit structure is improved.

14 Claims, 3 Drawing Sheets

(51) Int. Cl.
*H01L 23/48* (2006.01)
*H01L 23/552* (2006.01)
*H05K 1/09* (2006.01)
*H05K 1/11* (2006.01)
*H05K 1/18* (2006.01)
*H01L 23/50* (2006.01)

(52) U.S. Cl.
CPC .................. *H05K 1/115* (2013.01); *H05K 1/18* (2013.01); *H01L 23/50* (2013.01); *H01L 2924/19041* (2013.01); *H01L 2924/19105* (2013.01); *H01L 2924/37001* (2013.01); *H05K 2201/10015* (2013.01)

(56) References Cited

U.S. PATENT DOCUMENTS

| | | | | |
|---|---|---|---|---|
| 6,418,032 B2* | 7/2002 | Hirata | .................. | H05K 1/0225 361/780 |
| 6,515,868 B1* | 2/2003 | Sasaki | .................. | H05K 1/0231 361/502 |
| 6,580,931 B1* | 6/2003 | Shiotsu | .................. | H04B 15/00 343/702 |
| 7,019,972 B2* | 3/2006 | Kenny, Jr. | .................. | G06F 1/26 165/80.4 |
| 7,061,772 B2* | 6/2006 | Arai | .................. | H01P 1/20 333/181 |
| 2004/0021534 A1 | 2/2004 | Arai et al. | | |

* cited by examiner

CHIP AND CIRCUIT STRUCTURE

FIELD OF THE INVENTION

The present invention relates to a technical field of a chip, and more particularly to a chip and circuit structure.

BACKGROUND OF THE INVENTION

The competition of chip products is increased day by day, wherein a printed circuit board of some chip products is compacted to two layers, one layer is an element layer and the other layer is a copper grounding layer, for reducing the cost. Referring to FIG. 1, FIG. 1 is a structural schematic view of a traditional chip structure, Components on a copper grounding layer is shown by diagonal lines. The chip structure 10 comprises a chip 11 (shown by double slashes) disposed on the element layer of the printed circuit board 14, a plurality of bypass capacitors 12 disposed near the power pins of the chip 11, and a power line 13 (shown by double slashes) disposed on the copper grounding layer; An end of the bypass capacitor 12 is connected with the power pins, and the other end of the bypass capacitor 12 is connected with the power line 13 of the copper grounding layer, so that the current is supplied stably and the impedance is reduced.

The power pins are disposed around the chip 11, e.g. a timing controller for generating high speed signals of Low Voltage Differential Signaling (LVDS), the bypass capacitors 12 near the power pins must to be designed as a low-impedance circuit, so the power line 13 of the chip structure 10 is provided like a ring as seen in FIG. 1. The power line 13 is reached to the copper grounding layer by through holes specifically, and the current of the power line 13 is fed in the bypass capacitors 12 on the copper grounding layer, respectively, so that the copper grounding layer is formed as a semi-circular package.

Therefore, grounding of the copper grounding layer is separated from the semi-circular package, so that the heat dissipation effect and the yield of the chip 11 are influenced.

SUMMARY OF THE INVENTION

An object of the present invention is to provide a chip and circuit structure, which has a better heat dissipation effect and a higher yield to solve problems of the traditional chip structure and circuit structure with a poor heat dissipation effect and a lower yield.

To solve foregoing problems, the present invention provides a technical solution, as follows:

The present invention provides a chip structure, the chip structure is disposed on a printed circuit board provided with an element layer and a copper grounding layer, and comprises:

a chip body disposed on the element layer and having a plurality of power pins;

a power line disposed on the element layer for supplying electric power to the chip body;

a plurality of power input lines, each of which has a body disposed on the copper grounding layer, wherein two ends of the power input line are disposed on the element layer, and the body of the power input line is connected with the two ends thereof through corresponding through holes of the printed circuit board; and a bypass capacitors, each of which has one end connected with the power pins of the chip body through the element layer and the other end connected with the power line through the power input line;

wherein the body of the power input line is connected with one end of the power input line through a first through hole of the printed circuit board, and the body of the power input line is connect with the other end of the power input line through a second through hole of the printed circuit board;

the end of the power input line is connected with the bypass capacitors, and the other end of the power input line is connected with the power line.

The present invention also provides a chip structure, the chip structure is disposed on a printed circuit board provided with all element layer and a copper grounding layer, and comprises:

a chip body disposed on the element layer and having a plurality of power pins;

a power line disposed on the element layer for supplying electric power to the chip body;

a plurality of power input lines, each of which has a body disposed on the copper grounding layer, wherein two ends of the power input line are disposed on the element layer and the body of the power input line is connected with the two ends thereof through corresponding through holes of the printed circuit board; and a bypass capacitors, each of which has one end connected with the power pins of the chip body through the element layer and the other end connected with the power line through the power input line.

In the chip structure of the present invention, the body of the power input line is connected with one end of the power input line through a first through hole of the printed circuit board, and the body of the power input line is connect with the other end of the power input line through a second through hole of the printed circuit board.

In the chip structure of the present invention, the end of the power input line is connected with the bypass capacitors, and the other end of the power input line is connected with the power line.

In the chip structure of the present invention, the chip structure further comprises:

a power feed-in line disposed on the copper grounding layer and connected with the power line through a third through hole of the printed circuit board.

In the chip structure of the present invention, the chip structure further comprises:

a heat dissipation unit disposed on a back surface of the chip body.

In the chip structure of the present invention, the heat dissipation unit is an exposed copper structure disposed on the back surface of the chip body.

In the chip structure of the present invention, a projection area of the heat dissipation unit on the printed circuit board at least covers a projection area of a heat sink of the chip body on the printed circuit board.

In the chip structure of the present invention, the copper grounding layer has an integrated copper foil layer.

In the chip structure of the present invention, the width of the power line is 1.2 mm to 2.5 mm.

The present invention also provides a circuit structure, comprising:

a chip structure disposed on a printed circuit board provided with an element layer and a copper grounding layer, wherein the chip structure comprises:

a chip body disposed on the element layer and having a plurality of power pins;

a power line disposed on the element layer for supplying electric power to the chip body;

a plurality of power input lines, each of which has a body disposed on the copper grounding layer, wherein two ends of the power input line are disposed on the element layer, and the body of power input line is connected with the two ends thereof through corresponding through holes of the printed circuit board; and a bypass capacitors, each of which has one end connected with the power pins of the chip body through the element layer and the other end connected with the power line through the power input line.

In the circuit structure of the present invention, the body of the power input line is connected with one end of the power input line through a first through hole of the printed circuit board, and the body of the power input line is connect with the other end of the power input line through a second through hole of the printed circuit board.

In the circuit structure of the present invention, the end of the power input line is connected with the bypass capacitors, and the other end of the power input line is connected with the power line.

In the circuit structure of the present invention, the chip structure further comprises:

a power feed-in line disposed on the copper grounding layer and connected with the power line through a third through hole of the printed circuit board.

In the circuit structure of the present invention, the chip structure further comprises:

a heat dissipation unit disposed on a back surface of the chip body.

In the circuit structure of the present invention, the heat dissipation unit is an exposed copper structure disposed on the back surface of the chip body.

In the circuit structure of the present invention, a projection area of the heat dissipation unit on the printed circuit board at least covers a projection area of a heat sink of the chip body on the printed circuit board.

In the circuit structure of the present invention, the copper grounding layer has an integrated copper foil layer.

In the circuit structure of the present invention, the width of the power line is 1.2 mm to 2.5 mm.

In compared with the traditional chip and circuit structure, the power line of the chip and circuit structure of the present invention is disposed on the element layer, so that the copper grounding layer has a better heat dissipation effect, and the chip structure and circuit structure have a higher yield to solve problems of the traditional chip structure and circuit structure with a poor heat dissipation effect and a lower yield.

The above-mentioned content of the present invention can be best understood by referring to the following detailed description of the preferred embodiments and the accompanying drawings.

DETAILED DESCRIPTION OF THE PREFERRED EMBODIMENTS

Figure 1:
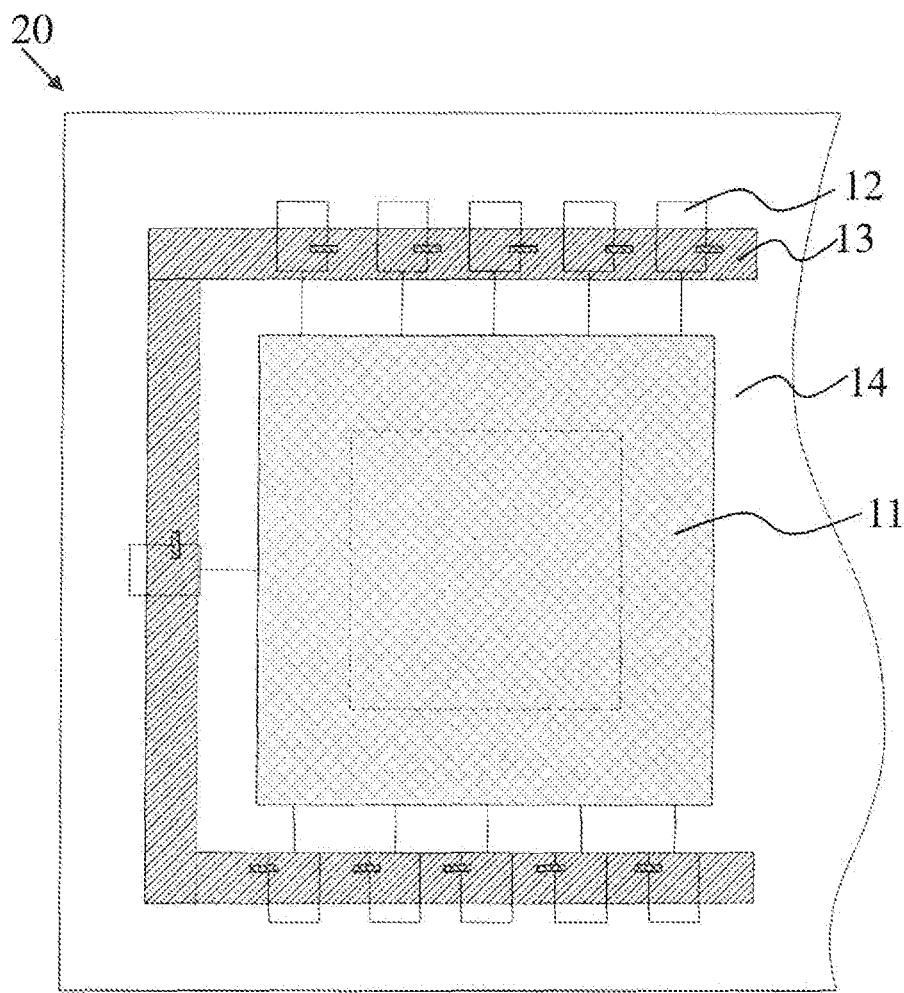
FIG. 1 is a structural schematic view of a traditional chip structure.

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, and etc., are only directions by referring to the accompanying drawings, and thus the used directional terms are used to describe and understand the present invention, but the present invention is not limited thereto.

In the drawings, similar structural units are designated by the same reference numerals.

Figure 2:
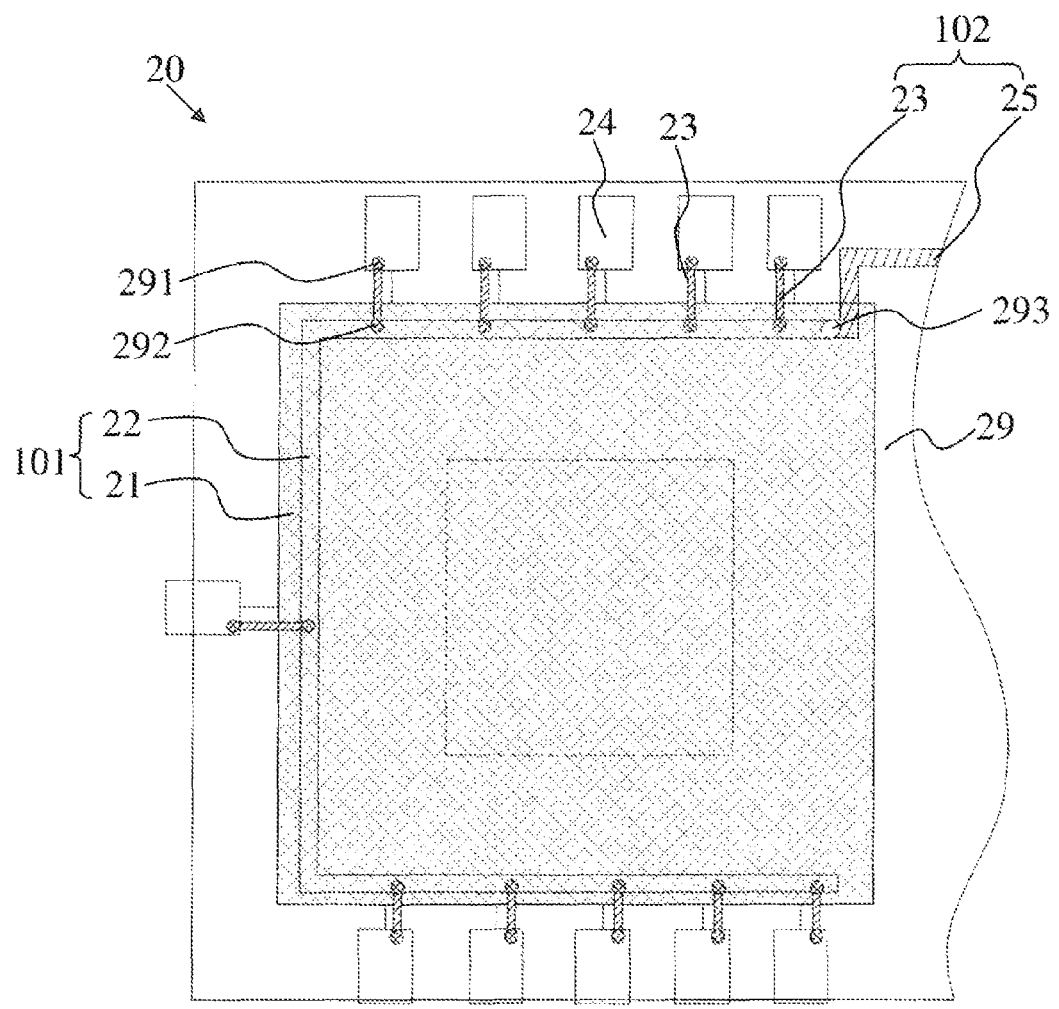
FIG. 2 is a structural schematic view of a chip structure according to a first preferred embodiment of the present invention.

Referring to FIG. 2, FIG. 2 is a structure schematic view of a chip structure according to a first preferred embodiment of the present invention. The chip structure 20 is disposed on an opposite printed circuit board 29, the printed circuit board 29 has an element layer 101 and a copper grounding layer 102, the elements of the chip structure 20 are disposed on the element layer 101, and the grounding and the cooling elements are disposed on the copper grounding layer 102.

The chip structure 20 comprises a chip body 21, a power line 22 (covered with the chip body 21), a plurality of power input lines 23, a plurality of bypass capacitors 24, and a power feed-in line 25. The chip body 21 (i.e. timing controller) is disposed on an element layer 101 and has a plurality of power pins, the power line 22 disposed on the element layer 101 for supplying electric power to the chip body 21, each of the power input lines 23 has a body disposed on the copper grounding layer 102, wherein two ends of the power input line 23 are disposed on the element layer 101, and the body of the power input line 23 is connected with the two ends thereof through corresponding through holes of the printed circuit board 29. Specifically, the body of the power input line 23 is connected with one end of the power input line 23 through a first through hole 291 of the printed circuit board 29, and the body of the power input line 23 is connect with the other end of the power input line 23 through a second through hole 292 of the printed circuit board 29, the bypass capacitors 24 are also disposed on the element layer 101, one end of the bypass capacitor 24 is connected with the power pins of the chip body 21 through the element layer 101 and the other end of the bypass capacitor 24 is connected with the power line 22 through the power input line 23, specifically, the end of the power input line 23 is connected with the bypass capacitors 24, and the other end of the power input line 23 is connected with the power line 22, the power feed-in line 25 is disposed on the copper grounding layer 102 and connected with the power line 22 through a third through hole 293 of the printed circuit board 22.

The power line 22 of the chip structure 20 of the preferred embodiment of the present invention is disposed on the element layer 101, the power line 22 is connected with a power source (not shown) through the power feed-in line 25, connected with the bypass capacitors 24 and the power pins of the chip body 21 through the power input line 23. The main elements of the chip structure 20 (power line 22, bypass capacitors 24 and chip body 21) are disposed on the element layer 101, the power input line 23 and the power feed-in line 25 (shown by diagonal) is disposed on the copper grounding layer 102, the power input line 23 is connected with the power line 22 and the bypass capacitors 24 on the element layer 101 through the first through hole 291 and second through hole 292 of the printed circuit board 29. So that the copper grounding layer 102 of the printed circuit board 29 can be disposed an integrated copper foil layer, the cooling effect and the anti-electromagnetic of the chip structure 20 are improved, and the yield of the chip 20 is improved.

When the chip structure 20 of the preferred embodiment is used, the power source is supplying power to the power line 22 of the element layer 101 by the power feed-in line 25 of the copper grounding layer 102 through the third through hole 293 of the printed circuit board 22. The power line 22 is connected with the end of the power input line 23 of the element layer 101, and supplying power to the bypass capacitors 24 of the element layer 101 through the body of the power input line 23 and the other end of the power input line 23. The bypass capacitors 24 are connected the power pins of the chip body 21 through the element layer 101, so that the chip body 21 can be supplied.

The power line of the chip structure of the preferred embodiment is disposed on the element layer 101, so that the heat dissipation effect of the copper grounding layer 102 is better, and the yield of the chip and corresponding circuit structure is improved.

Figure 3:
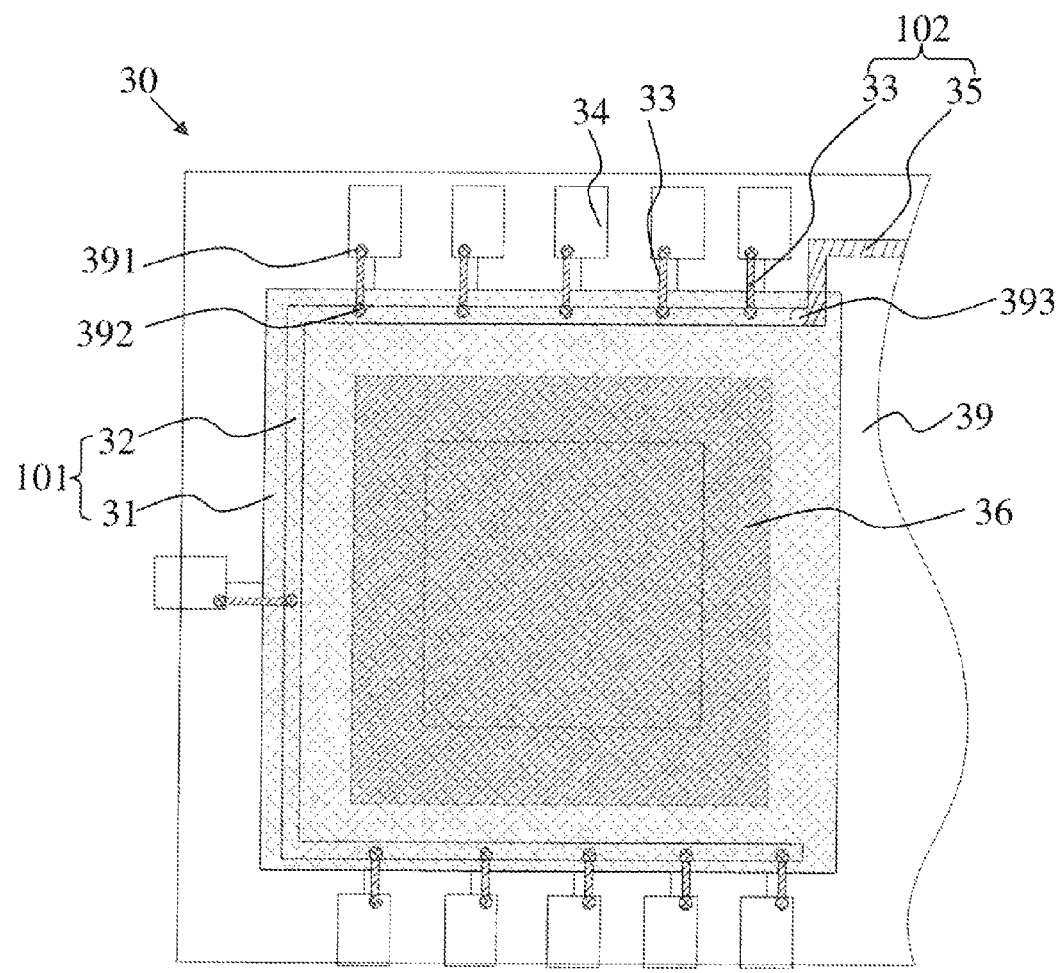
FIG. 3 is a structural schematic view of a chip structure according to a second preferred embodiment of the present invention.

Referring to FIG. 3, FIG. 3 is a structure schematic view of a chip structure according to a second preferred embodiment of the present invention. The chip structure is disposed on the corresponding printed circuit board 39, the printed circuit board 39 has an element layer 101 and a copper grounding layer 102, the elements of the chip structure 30 are disposed on the element layer 101, and the grounding and the cooling elements are disposed on the copper grounding layer 102.

The chip structure 30 comprises a chip body 31, a power line 32, a plurality of power input lines 33, a plurality of bypass capacitors 34, a power feed-in line 35, and a heat dissipation unit 36. The chip body 31 is disposed on an element layer 101 and has a plurality of power pins, the power line 32 disposed on the element layer 101 for supplying electric power to the chip body 31, each of the power input lines 33 has a body disposed on the copper grounding layer 102, wherein two ends of the power input line 33 are disposed on the element layer 101, and the body of the power input line 33 is connected with the two ends thereof through corresponding through holes of the printed circuit board 39. Specifically, the body of the power input line 33 is connected with one end of the power input line 33 through a first through hole 391 of the printed circuit board 39, and the body of the power input line 33 is connect with the other end of the power input line 33 through a second through hole 392 of the printed circuit board 39, the bypass capacitors 34 are also disposed on the element layer 101, one end of the bypass capacitor 34 is connected with the power pins of the chip body 31 through the element layer 101 and the other end of the bypass capacitor 34 is connected with the power line 32 through the power input line 33, specifically, the end of the power input line 33 is connected with the bypass capacitors 34, and the other end of the power input line 33 is connected with the power line 32, the power feed-in line 35 is disposed on the copper grounding layer 102 and connected with the power line 32 through a third through hole 393 of the printed circuit board 32. The heat dissipation unit 36 is an exposed copper structure disposed on the back surface of the chip body 31, the copper grounding layer 102 is excavated on the back surface of the chip body 31 far disposing the exposed copper structure.

the preferred embodiment is based on the first preferred embodiment, the main elements of the chip structure 30 are not only disposed on the element layer 101 to improve the cooling effect and the anti-electromagnetic of the chip structure 20, but the exposed copper structure is also disposed on the back surface of the chip body 31 as the heat dissipation unit 36, Preferably, a projection area of the heat dissipation unit 36 on the printed circuit board 39 at least covers a projection area of a heat sink of the chip body 31 on the printed circuit board 39, the exposed copper structure conducts the heat from the chip body 31, and the copper grounding layer 102 conducts the heat to outside, so that the heat dissipation effect of the chip structure 30 is improved.

In the preferred embodiment, the printed circuit board 39 has two layers, and the printed circuit board 39 comprises an element layer 101 disposed in the front and a copper grounding layer 102 disposed in the back (the element layer 101 is also disposed in the front of the printed circuit board 39 and the copper grounding layer 102 is disposed in the back of the printed circuit board 39), the chip body 31, the power line 32, the power input lines 33, the bypass capacitors 34 are disposed on the element layer 101, the body of the power input lines 33, the power feed-in line 35 and the heat dissipation unit are disposed on the copper grounding layer 102 of the printed circuit board 39.

Preferably, the power line 32 is disposed between the chip body 31 and the bypass capacitors 34 (and covered with the chip body 21), wherein the width of the power line 32 is 1.2 mm to 2.5 mm to save the space on the printed circuit board 39.

The preferred embodiment is based on the first preferred embodiment, wherein the exposed copper structure is disposed on the back surface of the chip body as the heat dissipation unit, and the heat dissipation effect of the chip structure is thus improved.

The present invention further provides a circuit structure, and the circuit structure comprises the above-mentioned chip structure. The operational principle of the circuit structure is the same as the related description of the first and second preferred embodiments. Specific illustration can be seen by referring to the above detailed descriptions of the first and second preferred embodiments.

The power line of the chip structure and the circuit structure of the present invention is disposed on the element layer, so that the heat dissipation effect of the copper grounding layer is better, and the yield of the chip and corresponding circuit structure is improved, so as to solve problems of the traditional chip structure and circuit structure with a poor heat dissipation effect and a lower yield.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A chip structure, disposed on a printed circuit board provided with an element layer and a copper grounding layer, comprising:
    a chip body disposed on the element layer and having a plurality of power pins;
    a power line disposed on the element layer for supplying electric power to the chip body;
    a plurality of power input lines, each of which has a body disposed on the copper grounding layer, wherein two ends of the power input line are disposed on the element layer, and the body of the power input line is connected with the two ends thereof through corresponding through holes of the printed circuit board;
    a plurality of bypass capacitors, each of which has one end connected with the power pins of the chip body through the element layer and the other end connected with the power line through the power input line; and
    a heat dissipation unit disposed on a back surface of the chip body, wherein the heat dissipation unit is an exposed copper structure disposed on the back surface of the chip body, and a portion of the copper grounding layer is excavated from the back surface of the chip body for providing the exposed copper structure;

wherein the body of the power input line is connected with one end of the power input line through a first through hole of the printed circuit board, and the body of the power input line is connect with the other end of the power input line through a second through hole of the printed circuit board;

the end of the power input line is connected with the bypass capacitors, and the other end of the power input line is connected with the power line.

2. The chip structure according to claim 1, wherein the chip structure further comprises:

a power feed-in line disposed on the copper grounding layer and-connected with the power line through a third through hole of the printed circuit board.

3. A chip structure, disposed on a printed circuit board provided with an element layer and a copper grounding layer, comprising:

a chip body disposed on the element layer and having a plurality of power pins;

a power line disposed on the element layer for supplying electric power to the chip body;

a plurality of power input lines, each of which has a body disposed on the copper grounding layer, wherein two ends of the power input line are disposed on the element layer, and the body of the power input line is connected with the two ends thereof through corresponding through holes of the printed circuit board;

a plurality of bypass capacitors, each of which has one end connected with the power pins of the chip body through the element layer and the other end connected with the power line through the power input line; and a heat dissipation unit disposed on a back surface of the chip body, wherein the heat dissipation unit is an exposed copper structure disposed on the back surface of the chip body, and a portion of the copper grounding layer is excavated from the back surface of the chip body for providing the exposed copper structure.

4. The chip structure according to claim 3, wherein the body of the power input line is connected with one end of the power input line through a first through hole of the printed circuit board, and the body of the power input line is connect with the other end of the power input line through a second through hole of the printed circuit board.

5. The chip structure according to claim 3, wherein the end of the power input line is connected with the bypass capacitors, and the other end of the power input line is connected with the power line.

6. The chip structure according to claim 3, wherein the chip structure further comprises:

a power feed-in line disposed on the copper grounding layer and connected with the power line through a third through hole of the printed circuit board.

7. The chip structure according to claim 3, wherein the copper grounding layer has an integrated copper foil layer.

8. The chip structure according to claim 3, wherein the width of the power line is 1.2 mm to 2.5 mm.

9. A circuit structure, comprising:

a chip structure disposed on a printed circuit board provided with an element layer and a copper grounding layer, wherein the chip structure comprises:

a chip body disposed on the element layer and having a plurality of power pins;

a power line disposed on the element layer for supplying electric power to the chip body;

a plurality of power input lines, each of which has a body disposed on the copper grounding layer, wherein two ends of the power input line are disposed on the element layer, and the body of power input line is connected with the two ends thereof through corresponding through holes of the printed circuit board;

a plurality of bypass capacitors, each of which has one end connected with the power pins of the chip body through the element layer and the other end connected with the power line through the power input line; and a heat dissipation unit disposed on a back surface of the chip body, wherein the heat dissipation unit is an exposed copper structure disposed on the back surface of the chip body, and a portion of the cooper grounding layer is excavated from the back surface of the chip body for providing the exposed copper structure.

10. The circuit structure according to claim 9, wherein the body of the power input line is connected with one end of the power input line through a first through hole of the printed circuit board, and the body of the power input line is connect with the other end of the power input line through a second through hole of the printed circuit board.

11. The circuit structure according to claim 9, where the end of the power input line is connected with the bypass capacitors, and the other end of the power input line is connected with the power line.

12. The circuit structure according to claim 9, where the chip structure further comprises:

a power feed-in line disposed on the copper grounding layer and-connected with the power line through a third through hole of printed circuit board.

13. The circuit structure according to claim 9, where the copper grounding layer has an integrated copper foil layer.

14. The circuit structure according to claim 9, where the width of the power line is 1.2 mm to 2.5 mm.

* * * * *